(12) United States Patent
Liao et al.

(10) Patent No.: US 11,001,759 B2
(45) Date of Patent: May 11, 2021

(54) RESIN COMPOSITION, AND PRE-PREG, METAL-CLAD LAMINATE, AND PRINTED CIRCUIT BOARD PREPARED USING THE SAME

(71) Applicant: TAIWAN UNION TECHNOLOGY CORPORATION, Chupei (TW)

(72) Inventors: Chih-Wei Liao, Chupei (TW); Chang-Chien Yang, Chupei (TW); Tsung-Hsien Lin, Chupei (TW); Ju-Ming Huang, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 425 days.

(21) Appl. No.: 16/009,627

(22) Filed: Jun. 15, 2018

(65) Prior Publication Data

US 2019/0203123 A1  Jul. 4, 2019

(30) Foreign Application Priority Data

Jan. 4, 2018 (TW) ................................. 107100361

(51) Int. Cl.
| | | |
|---|---|---|
| C09K 21/12 | (2006.01) | |
| C08K 5/5399 | (2006.01) | |
| C08K 5/521 | (2006.01) | |
| C08K 5/5313 | (2006.01) | |
| C08K 3/36 | (2006.01) | |
| C08J 3/24 | (2006.01) | |
| C08J 5/24 | (2006.01) | |
| H05K 1/03 | (2006.01) | |
| H05K 3/02 | (2006.01) | |
| B32B 5/02 | (2006.01) | |
| C08K 5/523 | (2006.01) | |

(52) U.S. Cl.
CPC ............... *C09K 21/12* (2013.01); *B32B 5/02* (2013.01); *C08J 3/24* (2013.01); *C08J 5/24* (2013.01); *C08K 3/36* (2013.01); *C08K 5/521* (2013.01); *C08K 5/523* (2013.01); *C08K 5/5313* (2013.01); *C08K 5/5399* (2013.01); *H05K 1/0373* (2013.01); *H05K 3/022* (2013.01); *B32B 2250/02* (2013.01); *B32B 2260/00* (2013.01); *B32B 2260/021* (2013.01); *B32B 2260/046* (2013.01); *B32B 2262/101* (2013.01); *B32B 2307/536* (2013.01); *B32B 2457/08* (2013.01); *C08J 2363/00* (2013.01); *C08K 2201/014* (2013.01); *H05K 2201/012* (2013.01)

(58) Field of Classification Search
None
See application file for complete search history.

(56) References Cited

U.S. PATENT DOCUMENTS

| | | | |
|---|---|---|---|
| 2014/0023839 A1* | 1/2014 | Wang ..................... | C08J 5/24 428/209 |
| 2016/0222204 A1 | 8/2016 | Wang et al. | |

FOREIGN PATENT DOCUMENTS

| | | | |
|---|---|---|---|
| TW | 201508034 A | | 3/2015 |
| TW | 201609781 | * | 3/2016 |
| TW | 201609781 A | | 3/2016 |
| WO | 2015179232 A1 | | 11/2015 |

OTHER PUBLICATIONS

Machine translation of TW201609781 (Year: 2016).*
Taiwan Office Action dated Aug. 24, 2018.

* cited by examiner

*Primary Examiner* — Shawn Mckinnon
(74) *Attorney, Agent, or Firm* — Michael W. Ferrell; Ferrells, PLLC; Anna Kinney

(57) ABSTRACT

A resin composition is provided. The resin composition comprises the following constituents:
(A) an epoxy resin, which has at least two epoxy functional groups per molecule;
(B) a reactive flame retardant with

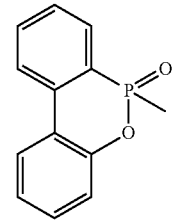

(a DOPO functional group) in structure; and
(C) a non-reactive phosphorus-containing flame retardant, which is compatible with the other constituents of the resin composition.

14 Claims, No Drawings

RESIN COMPOSITION, AND PRE-PREG, METAL-CLAD LAMINATE, AND PRINTED CIRCUIT BOARD PREPARED USING THE SAME

CLAIM FOR PRIORITY

This application claims the benefit of Taiwan Patent Application No. 107100361 filed on Jan. 4, 2018, the subject matters of which are incorporated herein in their entirety by reference.

BACKGROUND OF THE INVENTION

Field of the Invention

The present invention provides a resin composition, especially a halogen-free epoxy resin-based resin composition comprising a specific reactive flame retardant and a non-reactive phosphorus-containing flame retardant. The resin composition of the present invention can be used in combination with glass fibers to constitute a composite material or prepreg, and furthermore, can be used as a metal foil adhesive to prepare a laminate and printed circuit board.

Descriptions of the Related Art

Recently, since applications of electronic products have entered high-frequency and high-speed applications, the requirements on the physicochemical properties of the relevant electronic materials have become strict. Conventional electronic materials are failing to keep up with the trends of high-frequency and high-speed signal transmission, miniaturization of electronic elements, and high-density wiring of printed circuit hoards. One of the reasons is that an electronic material with good electrical properties (e.g., dielectric constant (Dk) and dissipation factor (Df)) usually has low peeling strength, and an electronic material with both good electrical properties and peeling strength usually has low glass transition temperature (Tg) and insufficient thermal resistance.

In addition, due to environmental awareness, the materials used to impart flame retardance to electronic materials are mainly halogen-free materials, usually nitrogen-containing compounds or phosphorus-containing compounds. However, when a DOPO-based compound is used as a flame retardant in an epoxy resin-based resin composition, the hardness of the laminate prepared thereby is so high that cracks occur during the subsequent drilling processing procedures of the laminate, thereby, adversely affecting the reliability of the final product in the subsequent processes. Here, DOPO is an abbreviation of "9,10-dihydro-9-oxa-10-phosphaphenanthrene-10-oxide". Although it is known that the hardness of the laminate can be lowered by adding a soft filler, like talc, or a toughener such as a core/shell rubber (CSR) into the resin composition from which the laminate is prepared, talc and CSR can cause several problems. For example, talc and CSR will deteriorate the peeling strength of the laminate and increase the possibility of interlayer delamination after an impact test.

In view of the above, there is still a need for an electronic material which has low Dk, low Df, high peeling strength, high Tg, and suitable hardness.

SUMMARY OF THE INVENTION

The technical problem to be solved by the present invention is to provide a resin composition that is useful in preparing an electronic material with high Tg, good electrical properties (low Dk and low Df), high peeling strength and a hardness that is suitable and advantageous to subsequent processing.

As illustrated in the following objectives, the technical means of the present invention is to use a reactive DOPO-based flame retardant and a non-reactive phosphorus-containing flame retardant in an epoxy resin-based resin composition to provide an electronic material from the resin composition with the aforementioned advantages and solve the problem of excessively high hardness caused by using a DOPO-based flame retardant alone.

An objective of the present invention is to provide a resin composition, which comprises the following constituents:

(A) an epoxy resin, which has at least two epoxy functional groups per molecule;

(B) a reactive flame retardant with

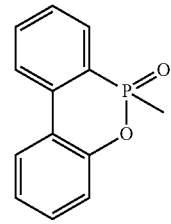 [SMILES: CP1(=O)Oc2ccccc2-c2ccccc21]

(also called as a "DOPO functional group", which is also expressed as "DOPO") in structure; and (C) a non-reactive phosphorus-containing flame retardant that is compatible with the other constituents of the resin composition.

In some embodiments of the present invention, the reactive flame retardant (B) is selected from the group consisting of 9,10-dihydro-9-oxa-10-phosphaphenanthrene-10-oxide (DOPO), 10-(2,5-dihydroxyphenyl)-9,10-dihydro-9-oxa-10-phosphaphenanthrene-10-oxide (DOPO-HQ), a DOPO functional group-containing bisphenol A (DOPO-bisphenol A, DOPO-BPA), a DOPO functional group-containing phenolic novolac (DOPO-phenolic novolac, DOPO-PN), a DOPO functional group-containing bisphenol A novolac (DOPO-bisphenol A novolac, DOPO-BPAN), a DOPO functional group-containing active ester (DOPO-active ester, DOPO-AE), derivatives thereof, and combinations thereof. The reactive flame retardant (B) is preferably a DOPO functional group-containing active ester (DOPO-AE).

In some embodiments of the present invention, the DOPO functional group-containing active ester has a structure of the following formula

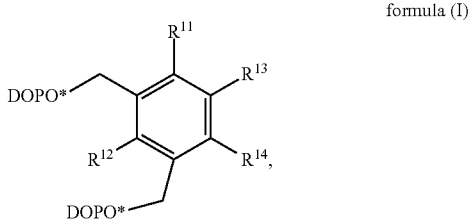

formula (I)

in formula (I),

DODO* is

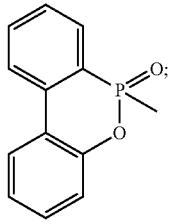 [SMILES: CP1(=O)Oc2ccccc2-c2ccccc21]

$R^{11}$ is H, —OC(=O)R*, or —OH, wherein R* is a $C_1$ to $C_8$ alkyl or a substituted or unsubstituted phenyl;

$R^{12}$ is H, —OH, or a $C_1$ to $C_6$ alkyl; and $R^{13}$ and $R^{14}$ are independently —CH$_2$-DODO*, H, —OC(=O)R*, a $C_1$ to $C_6$ alkyl, —OH, or

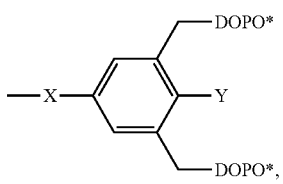

wherein X is a covalent bond, a $C_1$ to $C_6$ alkylene, or —SO$_2$—, and Y is H, —OC(=O)R*, or —OH, with the proviso that the DODO functional group-containing active ester has at least one —OC(=O)R* group per molecule;

with the proviso that when $R^{13}$ is

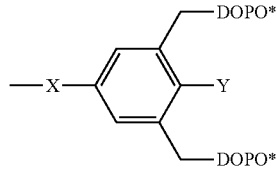

and at least one of $R^{11}$, $R^{12}$, and $R^{14}$ is —OH, Y is not —OH, and when $R^{14}$ is

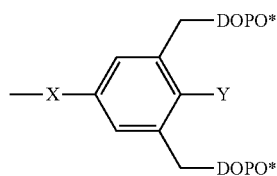

and at least one of $R^{11}$, $R^{12}$, is $R^{13}$ is —OH, Y is not —OH; and with the proviso that when at least one of $R^{11}$, $R^{12}$, $R^{13}$, $R^{14}$, and Y is —OC(=O)R*, and one of $R^{13}$ and $R^{14}$ is

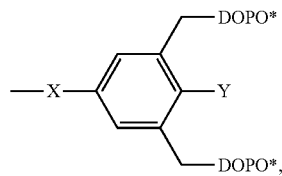

the other one of $R^{13}$ and $R^{14}$ is —CH$_2$-DOPO*, H, —OC(=O)R*, a $C_1$ to $C_6$ alkyl, or —OH.

In some embodiments of the present invention, the non-reactive phosphorus-containing flame retardant (C) is selected from the group consisting of hexaphenoxy cyclotriphosphazene, resorcinol bis[di(2,6-dimethylphenyl) phosphate], resorcinol bis(diphenyl phosphate), derivatives thereof, and combinations thereof.

In some embodiments of the present invention, the resin composition further comprises a cross-linking agent, which is selected from the group consisting of dicyandiamide (DICY), diaminodiphenyl sulfone (DDS), amino triazine novolac (ATN), bismaleimide (BMI) resin, styrene maleic anhydride (SMA) resin, benzoxazine (BZ) resin, and combinations thereof.

In some embodiments of the present invention, the resin composition further comprises a catalyst selected from imidazoles and pyridines.

In some embodiments of the present invention, the resin composition further comprises a filler selected from the group consisting of hollow silica), aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzes, diamonds, diamond-like carbon, graphites, calcined kaolin, pryan, micas, hydrotalcite, polytetrafluoroethylene (PTFE) powders, glass beads, ceramic whiskers, carbon nanotubes, nanosized inorganic powders, and combinations thereof.

In some embodiments of the present invention, the resin composition further comprises an additive selected from the group consisting of dispersing agents, tougheners, and combinations thereof.

Another objective of the present invention is to provide a prepreg, which is prepared by impregnating a substrate with the aforementioned resin composition or by coating the aforementioned resin composition onto a substrate and drying the impregnated or coated substrate.

Yet another objective of the present invention is to provide a metal-clad laminate, which is prepared by laminating the aforementioned prepreg with a metal foil or prepared by coating the aforementioned resin composition onto a metal foil and drying the coated metal foil.

Still another objective of the present invention is to provide a printed circuit board, which is prepared from the aforementioned metal-clad laminate.

To render the above objectives, the technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms.

Unless it is additionally explained, while describing the constituents in the solution, mixture and composition in the specification, the content of each constituent is calculated based on the dry weight, i.e., regardless of the weight of the solvent.

As used herein, the term "about" is in reference to the designated amount increasing or decreasing in a magnitude that is general and reasonable to persons skilled in the art.

The feature of the present invention lies in that the resin composition of the present invention is a formulation including an epoxy resin, a reactive DODO-based flame retardant, and a non-reactive phosphorus-containing flame retardant. The resin composition of the present invention is capable of improving the processability of the electronic material prepared thereby without sacrificing the physicochemical properties and electrical properties of the electronic material, thereby eliminating the disadvantages of conventional resin composition that uses a DODO-based flame retardant.

Resin Composition

The resin composition of the present invention comprises an epoxy resin, a reactive flame retardant with

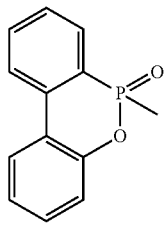 [SMILES: CP1(=O)Oc2ccccc2-c2ccccc21]

(a DOPO functional group) in structure, and a non-reactive phosphorus-containing flame retardant that is compatible with the other constituents of the resin composition as essential constituents and may further comprises selectable constituents depending on the need. The detailed descriptions for each constituents are provided below.

(A) Epoxy Resin

As used herein, an epoxy resin refers to a thereto-hardening resin with at least two epoxy functional groups in a molecule, such as a linear phenolic epoxy resin, a multi-functional epoxy resin, or a combination thereof. The aforementioned multi-functional epoxy resin may be but is not limited to a bifunctional epoxy resin, a tetrafunctional epoxy resin, or an octofunctional epoxy resin. Examples of the epoxy resin include but are not limited to bisphenol epoxy resins, phenolic epoxy resins, diphenylethylene epoxy resins, triazine skeleton-containing epoxy resins, fluorene skeleton-containing epoxy resins, triphenol methane epoxy resins, biphenyl epoxy resins, xylylene epoxy resins, biphenyl aralkyl epoxy resins, naphthalene epoxy resins, dicyclopentadiene (DCPD) epoxy resins, alicyclic epoxy resins, and combinations thereof. Examples of bisphenol epoxy resins include but are not limited to bisphenol A epoxy resins, bisphenol F epoxy resins, and bisphenol S epoxy resins. Examples of phenolic epoxy resins include but are not limited to phenol phenolic epoxy resins, cresol phenolic epoxy resins, bisphenol A phenolic epoxy resins, and bis-phenol F phenolic epoxy resins. Examples of the epoxy resin also include diglycidyl ether compounds of multi-ring aromatics such as multi-functional phenols and anthracenes. Furthermore, phosphorus may be introduced into the epoxy resin to provide a phosphorus-containing epoxy resin.

The aforementioned epoxy resins can be used either alone or by mixing two or more epoxy resins depending on the need of persons with ordinary skill in the art. In the appended examples, bisphenol A phenolic epoxy resins are used.

In the resin composition of the present invention, based on the dry weight of the resin composition, the content of the epoxy resin (A) may be about 25 wt % to about 75 wt %, and particularly about 30 wt % to about 65 wt %, such as 31 wt %, 33 wt %, 34 wt %, 35 wt %, 37 wt %, 39 wt %, 40 wt %, 42 wt %, 44 wt %, 45 wt %, 47 wt %, 48 wt %, 50 wt %, 52 wt %, 55 wt %, 57 wt %, 59 wt %, 60 wt %, 61 wt %, 62 wt %, or 64 wt %. When the content of the epoxy resin is within the above designated range, the electronic material prepared by using the resin composition can be ovided with particularly good electrical properties.

(B) Reactive Flame Retardant with a DOPO Functional Group in Structure

As used herein, a DOPO functional group refers to a structure derived from 9,10-dihydro-9-oxa-10-phospha-phenanthrene-10-oxide (DOPO) a covalent bond formed through its phosphorus atom, that is,

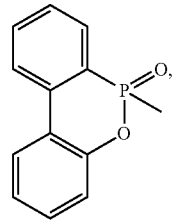 [SMILES: CP1(=O)Oc2ccccc2-c2ccccc21]

which is also expressed as "DOPO*". The DOPO-based compounds containing the DOPO functional group can be used as a flame retardant because the DOPO functional group contains a phosphorus atom.

Examples of the reactive flame retardant (B) with a DOPO functional group in structure (hereinafter "reactive flame retardant (B)") suitable for the present invention include but are not limited to 9,10-dihydro-9-oxa-10-phos-phaphenanthrene-10-oxide

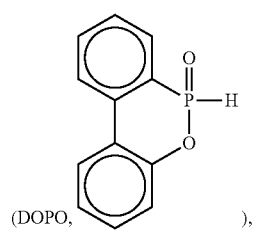

(DOPO,  ), 10-(2,5-dihydroxyphenyl)-9,10-dihydro-9-oxa-10-phospha-phenanthrene-10-oxide

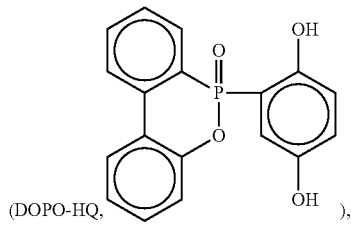

(DOPO-HQ), a DOPO functional group-containing bisphenol A

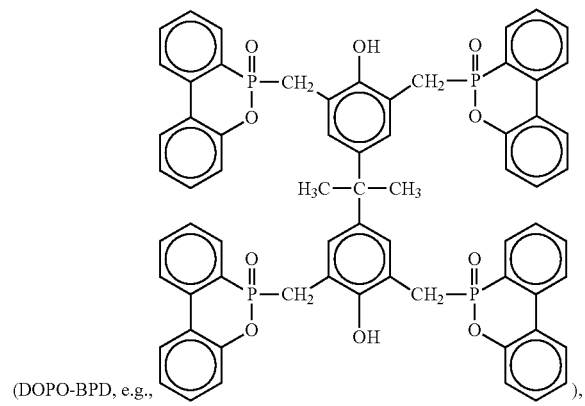

(DOPO-BPD, e.g., ), a DOPO functional group-containing phenolic novolac (DOPO-PN, e.g.,

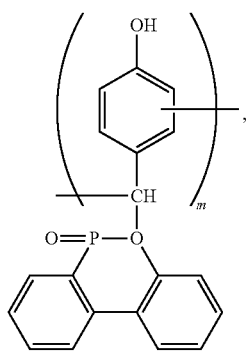

wherein m is an integer equal to or higher than 1), a DOPO functional group-containing bisphenol A novolac (DOPO-BPAN,

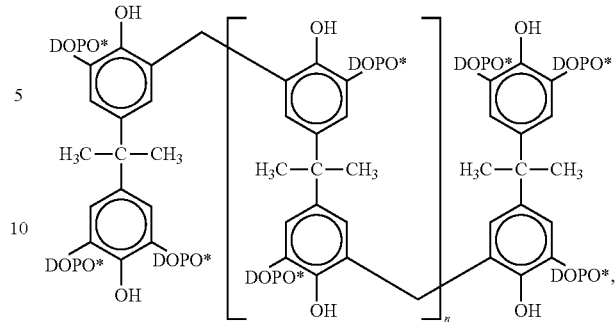

wherein n is an integer equal to or higher than 1), a DOPO functional group-containing active ester (DOPO-AE), and derivatives thereof. The aforementioned flame retardants can be used either alone or in any combination. Examples of the reactive flame retardant (B) that is commercially available include the product with trade name XZ-92741 (DOPO-BPAN) available from DOW CHEMICAL, the product with trade name LC-950 (DOPO-BPAN) available from SHIN-A Company, the product with trade name D992 (DOPO-BPAN) available from Sichuan EM Technology Co. Ltd., and the product with trade name DHP65H (DOPO-BPAN) available from Jiangsu Yoke Technology Co. Ltd. In the appended Examples, DOPO-BPAN and DOPO-AE are used.

The reactive flame retardant (B) is reactive because it has reactive group(s) in its molecular structure. Examples of the reactive group include a P—H group, a OH group, a $NH_2$ group, a COOH group, a C(O)O group, and the like. The reactive flame retardant (B) can serve as a cross-linking agent to carry out a curing reaction with the epoxy resin. The reactive flame retardant (B) can be embedded into the polymer structure formed of the cured resin composition via the formation of covalent bonds and thus avoid the migration of flame retardant to the surface of cured product. The migration problem usually occurs when an additive flame retardant is used because the additive flame retardant is not bonded to the polymer network of epoxy resin.

In the preferred embodiment of the present invention. DOPO-AE is used as the reactive flame retardant (B). DOPO-AE is a DOPO-based compound with an active ester group. The active ester group can react with an epoxy functional group of the epoxy resin. The difference between DOPO-AE and DOPO-BPA or DOPO-PN lies in that DOPO-BPA or DOPO-PN reacts with the epoxy functional group through an OH group, so that a polar secondary hydroxyl group will be generated after the ring-opening of the epoxy functional group. The polar secondary hydroxyl group will adversely affect the electrical properties and water absorption of the prepared electronic material. Unlike DOPO-BPA or DOPO-PN, DOPO-AE performs a transesterification reaction with the epoxy functional group through an active ester group and thus, does not lead to the aforementioned deteriorations in electrical properties and water absorption caused by the secondary hydroxyl group.

As used herein, the active ester moiety of DOPO-AE can be an aromatic polyester obtained from a polymerization reaction of an aromatic dicarboxylic acid (or a derivative thereof) and a bisphenol compound (or a derivative thereof). The aromatic polyester can be modified by DOPO to form a DOPO functional group-containing active ester (DOPO-AE), The aforementioned polymerization reaction can be performed by any conventional method, such as solution polymerization, interfacial polymerization, or melt polymerization. Examples of the aromatic dicarboxylic acid include but are not limited to terephthalic acid, isophthalic acid, o-phthalic acid, chloro-o-phthalic acid, nitro-o-phthalic acid, 2,5-naphthalene dicarboxylic acid, 2,6-naphthalene dicarboxylic acid, 2,7-naphthalene dicarboxylic acid, 1,5-naphthalene dicarboxylic acid, methyl-terephthalic acid, 4,4'-biphenyl dicarboxylic acid, 2,2'-biphenyl dicarboxylic acid, 4,4'-diphenyl ether dicarboxylic acid, 4,4'-diphenyl methane dicarboxylic acid, 4,4'-diphenyl sulfone dicarboxylic acid, 4,4'-diphenyl isopropylidene dicarboxylic acid, 1,2-bis(4-carboxyl phenoxy) ethane, and 5-sulfoisophthalic acid monosodium salt. The aforementioned aromatic dicarboxylic acids can be used either alone or in any combination. Among the aforementioned aromatic dicarboxylic acids, terephthalic acid, isophthalic acid, and mixtures thereof are preferable, and a mixture of terephthalic acid and isophthalic acid is more preferable. Examples of bisphenol compounds include but are not limited to bis(4-hydroxyphenyl) phenyl methane, 1,1-bis(4-hydroxy phenyl)-1-phenylethane (bisphenol AP, BPAP), 1,1-bis(4-hydroxy-3-methyl phenyl)-1-phenylethane, 1,1-bis(4-hydroxy-3,5-dimethyl phenyl)-1-phenylethane, 1,1-bis(4-hydroxy-3,5-dibromo phenyl)-1-phenylethane, 1,1-bis(4-hydroxy-3-phenyl phenyl)-1-phenylethane, 2,2-bis(4-hydroxyphenyl)propane (bisphenol A, BPA), 2,2-bis(4-hydroxy-3,5-dimethyl phenyl) propane (tetramethyl bisphenol A), 2,2-bis(4-hydroxy-3-methyl phenyl) propane (bisphenol C, BPC), 2,2-bis(4-hydroxy-3,5-dibromo phenyl) propane (tetrabromo bisphenol A), 2,2-bis(4-hydroxy-3,5-dichloro phenyl) propane (tetrachloro bisphenol A), and dicyclopentadiene-phenol polymers. The aforementioned bisphenol compounds and derivatives thereof can be used either alone or in any combination. Among the aforementioned bisphenol compounds, bisphenol A (BPA) and dicyclopentadiene-phenol polymers are preferable.

In some embodiments of the present invention, DOPO-AE has a structure of the following formula (I):

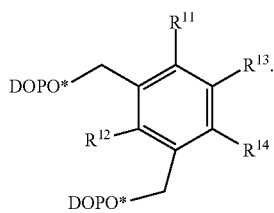

formula (I)

In formula (I), DOPO* is

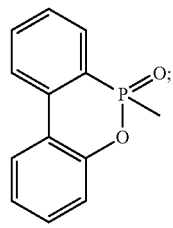 [SMILES: CP1(=O)Oc2ccccc2-c2ccccc21]

$R^{11}$ is H, —OC(=O)R*, or —OH, wherein R* is a $C_1$ to $C_8$ alkyl or a substituted or unsubstituted $R^{12}$ is H, —OC(=O)R*, —OH, or a $C_1$ to $C_6$ alkyl; and $R^{13}$ and $R^{14}$ are independently —CH$_2$-DOPO*, H, —OC(=O)R*, a $C_1$ to $C_6$ alkyl, —OH, or

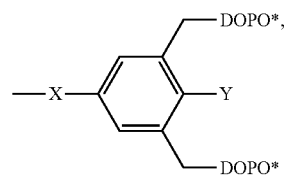

wherein X is a covalent bond, a $C_1$ to $C_6$ alkylene, or —SO$_2$—, and Y is H, —OC(=O)R*, or —OH. The structure of formula (I) has the following limitations: (1) the DOPO functional group-containing active ester has at least one —OC(=O)R* group per molecule; (2) when $R^{13}$ is

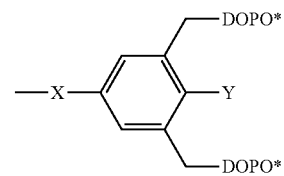

and at least one of $R^{11}$, $R^{12}$, and $R^{14}$ is —OH, Y is not —OH, and when $R^{14}$ is

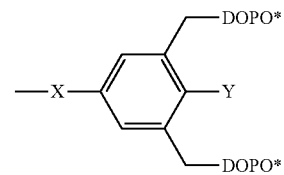

and at least one of $R^{11}$, $R^{12}$, and $R^{13}$ is —OH, Y is not —OH; and (3) when at least one of $R^{11}$, $R^{12}$, $R^{13}$, $R^{14}$ and Y is —OC(=O)R*, and one of $R^{13}$ and $R^{14}$ is

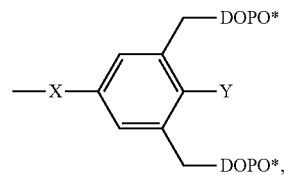

the other one of $R^{13}$ and $R^{14}$ is —CH$_2$-DOPO*, H, —OC(=O)R*, a C1 to C6 alkyl, or —OH.

In some embodiments of the present invention, DOPO-AE has a structure selected from one of the following formulas (I-1) to (I-6):

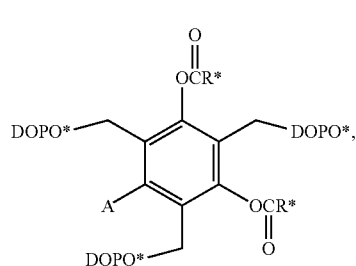

formula (I-1)

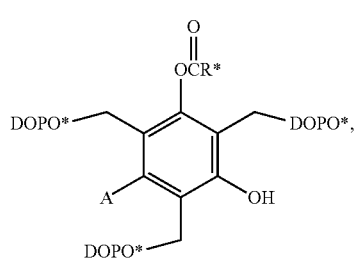

formula (I-2)

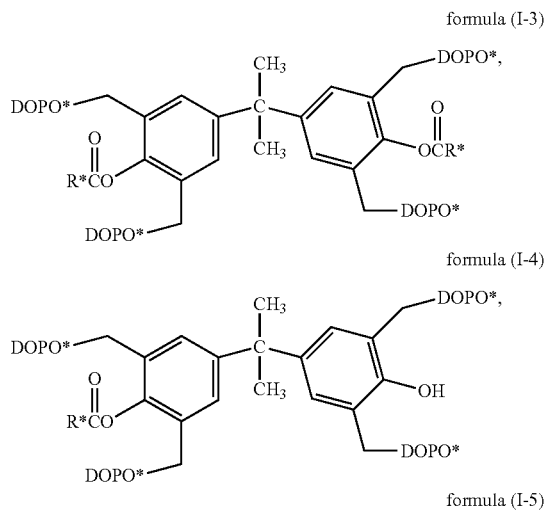

formula (I-3)

formula (I-4)

formula (I-5)

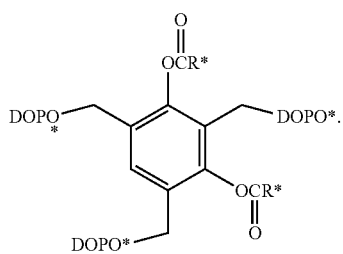

formula (I-6)

In formulas (I-1) to (I-6), DOPO* is as defined above R* is as defined above; A is a $C_1$ to $C_6$ alkyl, and preferably a $C_1$ to $C_3$ alkyl; and Z is a covalent bond, —$SO_2$—, or a $C_1$ to $C_6$ alkylene, and preferably a $C_1$ to $C_3$ alkylene.

The preparation method of the aforementioned DOPO-AE of formula (I) can be consulted in the Taiwan Patent Application Laid-open Publication No. TW 201609781 A, and the subject matters of which are incorporated herein in their entirety by reference.

In the resin composition of the present invention, based on the dry weight of the resin composition, the content of the reactive flame retardant (B) may be about 1 wt % to about 30 wt %, and particularly about 5 wt % to about 25 wt %, such as 5.5 wt %, 5.7 wt %, 5.9 wt %, 7 wt %, 9 wt %, 10 wt %, 12 wt %, 15 wt %, 17 wt %, 18 wt %, 19 wt %, 20 wt %, 21 wt %, 21.5 wt %, 22 wt %, or 24 wt %. When the content of the reactive flame retardant (B) is within the above designated range, the reactive flame retardant (B) can impart good flame retardance to the electronic material prepared by using the resin composition without affecting the characteristics of other constituents of the resin composition.

(C) Non-Reactive Phosphorus-Containing Flame Retardant

As used herein, the non-reactive phosphorus-containing flame retardant refers to a phosphorus-containing compound with no active group that can react with the epoxy resin. The non-reactive phosphorus-containing flame retardant is also called as an additive phosphorus-containing flame retardant. The non-reactive phosphorus-containing flame retardant (C) should have compatibility with other constituents of the resin composition. That is, in terms of molecular level, the non-reactive phosphorus-containing flame retardant (C) in the varnish formed from the resin composition is in a finely dispersed state.

Examples of the non-reactive phosphorus-containing flame retardant include but are not limited to phosphate esters, phosphazenes, phosphite esters, and phosphines. Examples of the phosphate ester include but are not limited to triphenyl phosphate, tricresyl phosphate, ditolyl diphenyl phosphate, cresyl diphenyl phosphate, and 1,3-phenylene bis(di-2,6-ditolyl phosphate). Phosphazenes can be a cyclic phosphazene compound or a linear phosphazene compound, wherein the cyclic phosphazene compound is also called as cyclophosphazene, which is a compound with phosphorus-nitrogen double bonds and a cyclic structure. Examples of the phosphite ester include but are not limited to trimethyl phosphite esters and triethyl phosphite esters. Examples of the phosphine include but are not limited to tris(4-methoxyphenyl)phosphine and triphenyl phosphine. The aforementioned non-reactive phosphorus-containing flame retardant can be used either alone or in any combination.

In some embodiments of the present invention, the non-reactive phosphorus-containing flame retardant (C) is selected from the group consisting of hexaphenoxy cyclotriphosphazene, resorcinol bis[di(2,6-dimethylphenyl) phosphate], resorcinol bis(diphenyl phosphate), derivatives thereof, and combinations thereof. In the appended Examples, the non-reactive phosphorus-containing flame retardant (C) is resorcinol bis[di(2,6-dimethylphenyl) phosphate] (

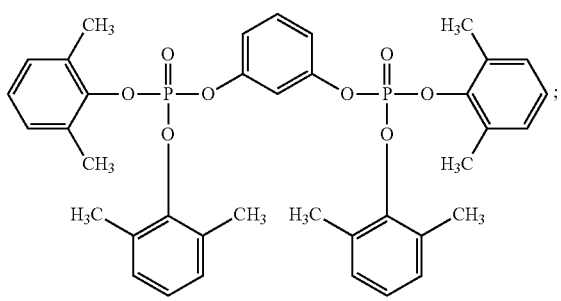 [SMILES: Cc1cccc(C)c1OP(=O)(Oc1cccc(OP(=O)(Oc2c(C)cccc2C)Oc2c(C)cccc2C)c1)Oc1c(C)cccc1C]

trade name: PX-200) available from DAIHACHI CHEMICAL INDUSTRY CO., LTD and hexaphenoxy cyclotriphosphazone (

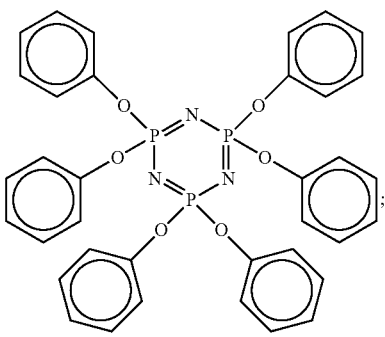

trade name: SPB-100) available from OTSUKA CHEMICAL CO., LTD.

In the resin composition of the present invention, based on the dry weight of the resin composition, the content of the non-reactive phosphorus-containing flame retardant (C) may range from 0.1 wt % to about 20 wt %, and particularly from 1 wt % to about 15 wt %, such as 2 wt %, 3 wt %, 3.5 wt %, 4 wt %, 4.5 wt %, 5 wt %, 7 wt %, 9 wt %, 9.5 wt %, 10 wt %, 11 wt %, 12 wt %, 13 wt %, or 14 wt %. Particularly when the content of the non-reactive phosphorus-containing flame retardant (C) is within the above designated range, the non-reactive phosphorus-containing flame retardant (C) can effectively decrease the hardness of the electronic material prepared by using the resin composition without affecting the characteristics of other constituents of the resin composition.

(D) Other Optional Constituents

The resin composition of the present invention may optionally further comprise other constituents, such as a cross-linking agent, catalyst or filler as described below and an additive well-known to persons with ordinary skill in the art, to improve the physicochemical properties of the electronic material prepared thereby or the processability of the resin composition during the preparation. Examples of the additive well-known to persons with ordinary skill in the art include but are not limited to a dispersing agent, toughener, and the like. Detailed descriptions for the cross-linking agent, catalyst, and filler as examples of the optional constituents are provided below.

<Cross-Linking Agent>

As used herein, a cross-linking agent refers to a constituent that can react with the epoxy resin to carry out a cross-linking curing reaction in addition to the reactive flame retardant (B). The type of the cross-linking agent is not particularly limited as long as the cross-linking agent can react with the epoxy resin. Generally, the cross-linking agent can be a compound containing hydroxyl group(s), a compound containing amino group(s), an anhydride compound, an active ester compound, and the like. Examples of the cross-linking agent include but are not limited DICY, DDS, ATN, BMI resin, SMA resin, BZ resin, diamino diphenylmethane, aromatic diamines, aromatic dianhydrides, aliphatic dianhydrides, copolymers of styrene and vinyl phenol, and the like. The aforementioned cross-linking agents can be used either alone or in any combination. In the appended Examples, DICY, DDS, and SMA resin are used.

Based on the dry weight of the resin composition, the content of the cross-linking agent may range from 0 wt % to about 25 wt %, such as 0.5 wt %, 1 wt %, 2 wt %, 3 wt %, wt %, 7 wt %, 9 wt %, 10 wt %, 12 wt %, 15 wt %, or 20 wt %. The content of the cross-linking agent is not limited to the aforementioned ranges but can be adjusted depending on the need of persons with ordinary skill in the art.

<Catalyst>

The resin composition may further comprise a catalyst to facilitate the reaction of epoxy functional groups and lower the required curing reaction temperature of the resin composition. The type of the catalyst is not particularly limited as long as the catalyst can promote the ring-opening of the epoxy functional groups and lower the curing reaction temperature of the resin composition. Examples of the catalyst include but are not limited to tertiary amines, quaternary ammoniums, imidazoles, and pyridines. The aforementioned catalysts can be used either alone or in any combination. Examples of the tertiary amine include but are not limited to dimethyl benzylamine, 2-(dimethylamino methyl) phenol, and 2,4,6-tris(dimethylamino methyl)phenol. Examples of the imidazole include but are not limited to 2-methyl imidazole, 2-ethyl-4-methyl imidazole (2E4MZ), and 2-phenyl imidazole. Examples of the pyridine include but are not limited to 2,3-diamino pyridine, 2,5-diamino pyridine, 2,6-diamino pyridine, 4-dimethylamino pyridine, 2-amino-3-methyl pyridine, 2-amino-4-methyl pyridine, and 2-amino-3-nitro pyridine. In some embodiments of the present invention imidazoles or pyridines are used.

Based on the dry weight of the resin composition, the content of the catalyst may range from 0 wt % to about 5 wt %, such as 0.01 wt %, 0.02 wt %, 0.07 wt %, 0.1 wt %, 0.2 wt %, 0.3 wt %, 0.5 wt %, 1 wt %, 2 wt %, 3 wt %, or 4 wt %. However, the content of the catalyst is not limited to the aforementioned ranges but can be adjusted depending on the need of persons with ordinary skill in the art.

<Catalyst>

The resin composition of the present invention may further comprise a filler, which can be an organic filler or an inorganic filler. The filler may be selected from the group consisting of silica (e.g., hollow silica), aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzes, diamonds, diamond-like carbon, graphites, calcined kaolin, pryan, micas, hydrotalcite, PTFE, powders, glass beads, ceramic whiskers, carbon nanotubes, nanosized inorganic powders, and combinations thereof, but the invention is not limited thereto.

Based on the dry weight of the resin composition, the content of the filler may range from 0 wt % to about 40 wt %, such as 1 wt %, 2 wt %, 3 wt %, 5 wt %, 7%, 10 wt %, 15 wt %, 20 wt %, 21 wt %, 22 wt %, 23 wt %, 25 wt %, 30 wt %, or 35 wt %. The content of the filler is not limited to the aforementioned ranges but can be adjusted depending on the need of persons with ordinary skill in the art.

Preparation of Resin Composition

The resin composition of the present invention may be prepared into varnish form for subsequent applications by evenly mixing the constituents of the resin composition (including the epoxy resin (A), the reactive flame retardant (B), the non-reactive phosphorus-containing flame retardant (C) and other optional constituents (D)) through a stirrer, and dissolving or dispersing the obtained mixture into a solvent. The solvent can be any inert solvent that can dissolve or disperse the constituents of the resin composition of the present invention, but does not react with the constituents. Examples of the solvent which can dissolve or disperse the constituents of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methyl-pyrolidone (NMP). The listed solvents can be used either alone or in any combination. The amount of the solvent is not particularly limited as long as the constituents of the resin composition can be evenly dissolved or dispersed therein. In the appended Examples, a mixture of toluene, methyl ethyl ketone and γ-butyrolactone is used.

Prepreg

The present invention also provides a prepreg prepared from the abovementioned resin composition. The prepreg is obtained by impregnating a substrate into the abovementioned resin composition or coating the aforementioned resin composition onto a substrate, and drying the impregnated or coated substrate. Examples of the substrate include glass fiber reinforcing materials (e.g., glass-fiber woven fabrics or non-woven fabrics, glass papers, and glass mats), kraft papers, short fiber cotton papers, nature fiber cloths, organic fiber cloths, and the like. In some embodiments of the present invention, 2116 glass fiber cloths are used as the reinforcing material, and the reinforcing material is heated and dried at 175° C. for 2 to 15 minutes (B-stage) to provide a semi-cured prepreg.

Metal-Clad Laminate and Printed Circuit Board

The present invention also provides a metal-clad laminate prepared from the abovementioned prepreg. The metal-clad laminate comprises a synthetic layer and a metal layer, wherein the synthetic layer is provided by the prepreg. Specifically, the metal-clad laminate may be prepared by superimposing a plurality of layers of the prepregs and then superimposing a metal foil (such as a copper foil) on at least one external surface of an synthetic layer composed of the superimposed prepregs to provide a superimposed object, and performing a hot-pressing operation onto the superimposed object to obtain the metal-clad laminate. Alternatively, the metal-clad laminate may be prepared by directly coating the aforementioned resin composition onto a metal foil and drying the coated metal foil.

Furthermore, a printed circuit board may be prepared by further patterning the external metal foil of the aforementioned metal-clad laminate.

The present invention will be further illustrated by the embodiments hereinafter, wherein the measuring instruments and methods are respectively as follows:

[Water Absorption Test]

The moisture resistance of the metal-clad laminate is tested by a pressure cooker test (PCT), i.e., subjecting the metal-clad laminate into a pressure container (121° C., saturated relative humidity (100% R.H.) and 1.2 atm) for 2 hours.

[Solder Resistance Test]

The solder resistance test is carried out by immersing the dried metal-clad laminate in a solder bath (i.e., solder dip) at 288° C. for a certain period and observing whether there is any defect such as delamination and blistering.

[Peeling Strength Test]

The peeling strength refers to the bonding strength between the metal foil and laminated prepreg, which is expressed by the force required for vertically peeling the clad copper foil with a width of ⅛ inch from the surface of the laminated prepreg in the peeling strength test.

[Glass Transition Temperature (Tg) Test]

The glass transition temperature (Tg) is measured by using a Differential Scanning Calorimeter (DSC), wherein the measuring methods are IPC-TM-650.2.4.25C and 24C testing method of the Institute for Interconnecting and Packaging Electronic Circuits (IPC).

[Coefficient of Thermal Expansion (CTE) Test]

The coefficient of thermal expansion (CTE) of the sample (a metal-clad laminate in a size of 3 mm$^2$) in thickness direction (i.e., z-axis direction) is tested by the thermal expansion analyzer of TA instrument company (model No.: TA 2940) between a temperature gap ranging from 50° C. to 260° C.; (heating rate: 10° C./min).

[Flame Retardance Test]

The flame retardance test is carried out according to UL94V (Vertical Burn), which comprises the burning of a metal-clad laminate, which is held vertically, using a Bunsen burner to compare its self-extinguishing properties and combustion-supporting properties. The ranking for the flame retardance levels is V0>V1>V2.

[Dielectric Constant (Dk) and Dissipation Factor (Df) Measurement]

Dk and Df of the metal-clad laminate are measured according to IPC TM-650 under an operating frequency of 10 GHz. The resin content (RC) of the tested prepreg is about 53%.

[Impact Delamination Test]

The impact delamination test is carried out by impacting the metal-clad laminate by GARDNER ISO impact tester (available from BYK Company) and observing whether delamination is occurred or not thereafter. If no delamination is observed, the impact delamination test is recorded as "PASS". If delamination is occurred, the impact delamination test is recorded as "FAIL".

[Test of Drill Wear]

The drill wear is tested by repeatedly drilling the metal-clad laminate by using a drill with a diameter of 0.3 mm for 2000 times, and then observing the wear of the drill top surface. Since the cutting edge (CE) of the drill is continuously in contact with the metal-clad laminate and worn, the cutting corner (CC) of the cutting edge CE will be worn. In this test, unworn percentage of drill is obtained by measuring the length of chisel edge of the cutting corner CC. The calculation method for the unworn percentage of drill is as follows: (b/a)×100%, wherein "a" is the initial length of chisel edge of the drill before drilling, and "b" is the length of chisel edge of the drill after 2000 times drilling. The higher the value of the unworn percentage of drill, the higher the integrity of the drill, that is, the lower the drill wear.

EXAMPLE

[Preparation of Resin Composition]

Example 1

According to the ratio shown in Table 1, an epoxy resin a name: BNE 210, available from Chang Chun Plastics Co., Ltd.), DOPO-BPAN (trade name: XZ-92741, available from DOW Chemical) as a reactive flame retardant (B), hexaphenoxy cyclotriphosphazene (trade name: SPB-100, available from OTSUKA CHEMICAL) as a non-reactive phosphorus-containing flame retardant (C), DDS (available from UNION CHEMICAL) and DICY (available from UNION CHEMICAL) as cross-linking agents, SiO$_2$ filler (trade name: 525 ARI, available from Sibelco), and 2E4MZ (available from UNION CHEMICAL IND. CO., LTD) as a catalyst were mixed under room temperature with a stirrer followed by adding toluene, methyl ethyl ketone and γ-butyrolactone (all available from Fluka Company) thereinto.

After stirring the resultant mixture under room temperature for 60 to 120 minutes, resin composition 1 was obtained.

Example 2

The preparation procedures of resin composition 1 were repeated to prepare resin composition 2, except that DOPO-BPAN was substituted by DOPO-AE (trade name: E15, available from ICL Company) as the reactive flame retardant (B), cross-linking agent DDS was not used, and the amounts of the non-reactive phosphorus-containing flame retardant (C), cross-linking agent DICY and SiO$_2$ filler were adjusted as shown in Table 1.

Example 3

The preparation procedures of resin composition 1 were repeated to prepare resin composition 3, except that DDS and DICY were substituted by SMA resin (trade name: EF-40, available from CRAY VALLEY) as the cross-linking agent, reactive flame retardant (B) DOPO-AE was further added, and the amounts of the epoxy resin, the non-reactive phosphorus-containing flame retardant (C), SiO$_2$ filler and the catalyst were adjusted as shown in Table 1.

Example 4

The preparation procedures of resin composition 2 were repeated to prepare resin composition 4, except that hexaphenoxy cyclotriphosphazene was substituted by resorcinol bis[di(2,6-dimethylphenyl) phosphate] (trade name: PX-200, available from DAIHACHI CHEMICAL INDUSTRY) as the non-reactive phosphorus-containing flame retardant (C) as shown in Table 1.

Comparative Example 1

The preparation procedures of resin composition 1 were repeated to prepare comparative resin composition 1, except that the non-reactive phosphorus-containing flame retardant (C) was not used, and the amount of the reactive flame retardant (B) was adjusted as shown in Table 2.

Comparative Example 2

The preparation procedures of resin composition 1 were repeated to prepare comparative resin composition 2, except that the reactive flame retardant (B) and cross-linking agent DDS were not used, and the amounts of the non-reactive phosphorus-containing flame retardant (C) and SiO$_2$ filler were adjusted as shown in Table 2.

Comparative Example 3

The preparation procedures of resin composition 2 were repeated to prepare comparative resin composition 3, except that the non-reactive phosphorus-containing flame retardant (C) and the catalyst were not used, and the amounts of the reactive flame retardant (B) and SiO$_2$ filler were adjusted as shown in Table 2.

Comparative Example 4

According to the ratio shown in Table 2, epoxy resin BNE-210, phosphorus-containing epoxy resin (trade name: BEP-330, available from Chang Chun Plastics), cross-linking agent DICY, SiO$_2$ filler 525 ARI, and catalyst 2E4MZ were mixed under room temperature with a stirrer followed by adding toluene, methyl ethyl ketone and γ-butyrolactone thereinto. After stirring the resultant mixture under room temperature for 60 to 120 minutes, comparative resin composition 4 was obtained.

Comparative Example 5

The preparation procedures of comparative resin composition 1 were repeated to prepare comparative resin composition 5, except that talc (available from Sibelco) was further added as a filler, and the amount of SiO$_2$ filler was adjusted as shown in Table 2.

Comparative Example 6

The preparation procedures of resin composition 3 were repeated to prepare comparative resin composition 6, except that the non-reactive phosphorus-containing flame retardant (C) was not used, and the amounts of the reactive flame retardants (B) DOPO-BPAN and DOPO-AE were adjusted as shown in Table 2.

TABLE 1

Composition of resin composition

| Unit: parts by weight | | Example 1 | Example 2 | Example 3 | Example 4 |
|---|---|---|---|---|---|
| Epoxy resin | BNE-210 | 125 | 125 | 225 | 125 |
| Cross-linking agent | EF-40 | | | 130 | |
| | DDS | 25 | | | |
| | DICY | 0.2 | 1 | | 1 |
| Filler | 525 ARI | 60 | 45 | 150 | 45 |
| Non-reactive phosphorus-containing flame retardant (C) | SPB-100 | 10 | 20 | 30 | |
| | PX-200 | | | | 25 |
| Reactive flame retardant (B) | XZ-92741 | 60 | | 80 | |
| | E15 | | 12 | 48 | 12 |
| Catalyst | 2E4MZ | 0.2 | 0.2 | 0.1 | 0.2 |

TABLE 2

Composition of comparative resin composition

| Unit: parts by weight | | Comparative example 1 | 2 | 3 | 4 | 5 | 6 |
|---|---|---|---|---|---|---|---|
| Epoxy resin | BNE-210 | 125 | 125 | 125 | 20 | 125 | 225 |
| Phosphorus-containing epoxy resin | BEP-330 | | | | 120 | | |
| Cross-linking agent | EF-40 | | | | | | 130 |
| | DDS | 25 | | | | 25 | |
| | DICY | 0.2 | 0.2 | | 2.8 | 0.2 | |
| Filler | 525ARI | 60 | 55 | 50 | 35 | 30 | 150 |
| | talc | | | | | 30 | |
| Non-reactive phosphorus-containing flame retardant (C) | SPB-100 | | 30 | | | | |
| Reactive flame retardant (B) | XZ-92741 | 90 | | | | 90 | 120 |
| | E15 | | | 54 | | | 72 |
| Catalyst | 2E4MZ | 0.2 | 0.2 | 0.2 | 0.1 | 0.2 | 0.1 |

[Preparation of Metal-Clad Laminate]

Metal-clad laminates 1 to 4 and comparative metal-clad laminates 1 to 6 were prepared by using resin compositions 1 to 4 and comparative resin compositions 1 to 6, respectively. First, glass fiber cloths (trade name: 2116, thickness: 0.08 mm) were respectively impregnated into resin compositions 1 to 4 and comparative resin compositions 1 to 6 by means of a roller coating machine. The thickness of the glass fiber cloths was controlled to an appropriate extent. Next, the impregnated glass fiber cloths were placed in an oven and heated and dried at 175° C. for 2 to 15 minutes to produce prepregs in a semi-cured state (B-stage) (resin content of the prepregs: about 53%). Afterwards, four pieces of the prepregs were superimposed and two sheets of copper foil (0.5 oz.) were respectively superimposed on both of the two outer surfaces of the superimposed prepregs to provide a superimposed object. A hot-pressing operation was performed on each of the prepared objects to provide metal-clad laminates 1 to 4 (corresponding to resin compositions 1 to 4, respectively) and comparative metal-clad laminates 1 to 6 (corresponding to comparative resin compositions 1 to 6, respectively). Herein, the hot-pressing conditions are as follows: raising the temperature to about 200° C. to 220° C. with a heating rate of 3.0° C./min, and hot-pressing for 180 minutes under a full pressure of 15 kg/cm$^2$ (initial pressure is 8 kg/cm$^2$) at said temperature.

The water absorption, solder resistance, peeling strength, glass transition temperature (Tg), coefficient of thermal expansion (CTE), flame retardance, dielectric constant (Dk), dissipation factor (Df), impact delamination test and unworn percentage of drill of metal-clad laminates 1 to 4 and comparative metal-clad laminates 1 to 6 were analyzed, and the results are tabulated in Tables 3 and 4.

TABLE 3

Properties of metal-clad laminate

|  |  | Metal-clad laminate | | | |
| --- | --- | --- | --- | --- | --- |
|  | Unit | 1 | 2 | 3 | 4 |
| Water absorption | % | 0.21 | 0.24 | 0.17 | 0.22 |
| Solder resistance | minute | >10 | >10 | >10 | >10 |
| Peeling strength | pound/inch | 5.6 | 5.6 | 4.5 | 5.7 |
| Tg | ° C. | 205 | 200 | 170 | 179 |
| CTE | % | 2.1 | 2.1 | 3.2 | 3 |
| Flame retardance | UL grade | V0 | V0 | V0 | V0 |
| Dk @ 10 GHz |  | 4.3 | 4.4 | 3.6 | 4.4 |
| Df @ 10 GHz |  | 0.016 | 0.015 | 0.01 | 0.018 |
| Impact delamination test |  | PASS | PASS | PASS | PASS |
| Unworn percentage of drill | % | 61 | 67 | 61 | 61 |

TABLE 4

Properties of comparative metal-clad laminate

|  |  | Comparative metal-clad laminate | | | | | |
| --- | --- | --- | --- | --- | --- | --- | --- |
|  | Unit | 1 | 2 | 3 | 4 | 5 | 6 |
| Water absorption | % | 0.25 | 0.2 | 0.22 | 0.25 | 0.25 | 0.19 |
| Solder resistance | minute | >10 | >10 | >10 | >10 | >10 | >10 |
| Peeling strength | pound/inch | 5.7 | 5 | 5.8 | 5.3 | 4 | 4.5 |
| Tg | ° C. | 210 | 185 | 200 | 175 | 210 | 170 |
| CTE | % | 2 | 2.6 | 2.1 | 3 | 2 | 3.2 |
| Flame retardance | UL grade | V0 | V1 | V0 | V0 | V0 | V0 |
| Dk @ 10 GHz |  | 4.3 | 4.3 | 4.4 | 4.4 | 4.3 | 3.6 |
| Df @ 10 GHz |  | 0.016 | 0.015 | 0.014 | 0.017 | 0.016 | 0.01 |
| Impact delamination test |  | PASS | PASS | PASS | PASS | FAIL | PASS |
| Unworn percentage of drill | % | 39 | 78 | 42 | 40 | 75 | 45 |

As shown in Table 3, the electronic materials (i.e., metal-clad laminates 1 to 4) prepared by using the resin compositions of the present invention are provided with satisfactory physicochemical properties and electrical properties, including water absorption, thermal resistance, thermal expansion rate, flame retardance, Dk and Df, and acceptable unworn percentage of drill. By contrast, as shown in Table 4, the electronic materials (i.e., comparative metal-clad laminates 1 to 6) prepared by using the comparative resin compositions are provided with unsatisfactory physicochemical properties, electrical properties and unworn percentage of drill. Specifically, when the resin composition comprises the reactive flame retardant (B) but does not comprise the non-reactive phosphorus-containing flame retardant (C), as shown in Comparative examples 1, 3 and 6, the electronic materials prepared thereby are provided with obviously deteriorated unworn percentage of drill. When the resin composition uses a phosphorus-containing epoxy resin having DOPO* in structure rather than a flame retardant to impart flame retardance, as shown in Comparative example 4, the electronic material prepared thereby is provided with obviously deteriorated unworn percentage of drill. When the resin composition does not comprise the reactive flame retardant (B), as shown in Comparative example 2, although the electronic material prepared thereby is provided with better unworn percentage of drill, it is poor in peeling strength, flame retardance and Tg. In addition, when a conventional method, i.e., adding talc, is used to resolve the problem of poor unworn percentage of drill caused by using a DOPO-based flame retardant, as shown in Comparative example 5, the electronic material prepared thereby is provided with significantly lower peeling strength (only 4 pounds/inch) and fails to pass the impact delamination test.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:
   (A) an epoxy resin, which has at least two epoxy functional groups per molecule;

(B) a reactive flame retardant having a DOPO functional group in structure, wherein the DOPO functional group is

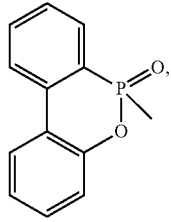 [SMILES: CP1(=O)Oc2ccccc2-c2ccccc21]

wherein the reactive flame retardant (B) is a combination of a DOPO functional group-containing bisphenol A novolac (DOPO-bisphenol A novolac, DOPO-BPAN) and a DOPO functional group-containing active ester (DOPO-active ester, DOPO-AE); and (C) a non-reactive phosphorus-containing flame retardant that is compatible with the other constituents of the resin composition, wherein the non-reactive phosphorus-containing flame retardant (C) is selected from phosphazenes.

2. The resin composition of claim 1, wherein the DOPO functional group-containing active ester has a structure of the following formula (I):

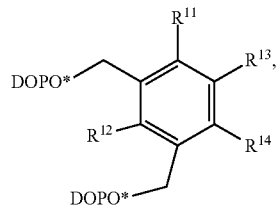

formula (I)

in formula (I),
DOPO* is

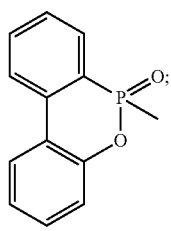 [SMILES: CP1(=O)Oc2ccccc2-c2ccccc21]

$R^{11}$ is H, —OC(=O)R*, or —OH, wherein R* is a $C_1$ to $C_8$ alkyl or a substituted or unsubstituted phenyl;

$R^{12}$ is H, —OC(=O)R*, —OH, or a $C_1$ to $C_6$ alkyl; and $R^{13}$ and $R^{14}$ are independently —CH$_2$-DOPO*, H, —OC(=O)R*, a $C_1$ to $C_6$ alkyl, —OH, or

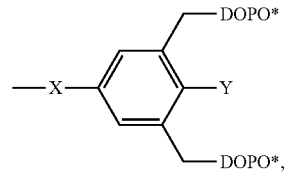

wherein X is a covalent bond, a $C_1$ to $C_6$ alkylene, or —SO$_2$—, and Y is H, —OC(=O)R*, or —OH, with the proviso that the DOPO functional group-containing active ester has at least one —OC(=O)R* group per molecule;

with the proviso that when $R^{13}$ is

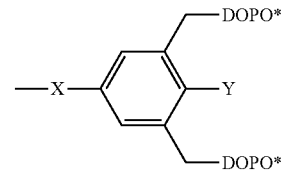

and at least one of $R^{11}$, $R^{12}$, and $R^{14}$ is —OH, Y is not —OH, and when $R^{14}$ is

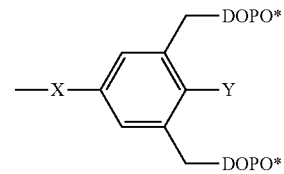

and at least one of $R^{11}$, $R^{12}$, and $R^{13}$ is —OH, Y is not —OH; and with the proviso that when at least one of $R^{11}$, $R^{12}$, $R^{13}$, $R^{14}$, and Y is —OC(=O)R*, and one of $R^{13}$ and $R^{14}$ is

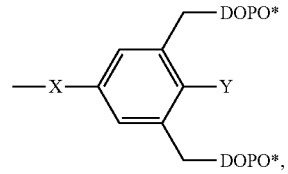

the other one of $R^{13}$ and $R^{14}$ is —CH$_2$-DOPO*, H, —OC(=O)R*, a $C_1$ to $C_6$ alkyl, or —OH.

3. The resin composition of claim 1, wherein the non-reactive phosphorus-containing flame retardant (C) is hexaphenoxy cyclotriphosphazene.

4. The resin composition of claim 1, further comprising a cross-linking agent.

5. The resin composition of claim 2, further comprising a cross-linking agent.

6. The resin composition of claim 4, wherein the cross-linking agent is selected from the group consisting of dicyandiamide (DICY), diaminodiphenyl sulfone (DDS), amino triazine novolac (ATN), bismaleimide (BMI) resin, styrene maleic anhydride (SMA) resin, benzoxazine (BZ) resin, and combinations thereof.

7. The resin composition of claim 1, further comprising a catalyst selected from imidazoles and pyridines.

8. The resin composition of claim 1, further comprising a filler selected from the group consisting of silica, aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzes, diamonds, diamond-like carbon, graphites, calcined kaolin, pryan, micas, hydrotalcite, polytetrafluoroethylene (PTFE) powders, glass beads, ceramic whiskers, carbon nanotubes, nanosized inorganic powders, and combinations thereof.

9. The resin composition of claim 1, further comprising an additive selected from the group consisting of dispersing agents, tougheners, and combinations thereof.

10. A prepreg, which is prepared by impregnating a substrate with the resin composition of claim 1 or by coating the resin composition of claim 1 onto a substrate and drying the impregnated or coated substrate.

11. A metal-clad laminate, which is prepared by laminating the prepreg of claim 10 and a metal foil.

12. A printed circuit board, which is prepared from the metal-clad laminate of claim 11.

13. A metal-clad laminate, which is prepared by coating the resin composition of claim 1 onto a metal foil and drying the coated metal foil.

14. A printed circuit board, which is prepared from the metal-clad laminate of claim 13.

* * * * *